US008566667B2

(12) United States Patent
Hu et al.

(10) Patent No.: US 8,566,667 B2
(45) Date of Patent: Oct. 22, 2013

(54) LOW DENSITY PARITY CHECK CODE DECODING SYSTEM AND METHOD

(75) Inventors: Xinde Hu, San Diego, CA (US); Levente Peter Jakab, San Diego, CA (US); Dillip K. Dash, San Diego, CA (US); Rohit Komatineni, Alvarez, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

(21) Appl. No.: 13/343,684

(22) Filed: Jan. 4, 2012

(65) Prior Publication Data

US 2013/0031438 A1    Jan. 31, 2013

Related U.S. Application Data

(60) Provisional application No. 61/513,480, filed on Jul. 29, 2011.

(51) Int. Cl.
*H03M 13/00* (2006.01)

(52) U.S. Cl.
USPC ............ 714/758; 714/752; 714/759; 714/779

(58) Field of Classification Search
None
See application file for complete search history.

(56) References Cited

U.S. PATENT DOCUMENTS

| | | | | |
|---|---|---|---|---|
| 6,757,122 | B1 * | 6/2004 | Kuznetsov et al. | 360/53 |
| 8,091,013 | B2 * | 1/2012 | Blanksby et al. | 714/786 |
| 2005/0149845 | A1 * | 7/2005 | Shin et al. | 714/801 |
| 2007/0011568 | A1 * | 1/2007 | Hocevar | 714/758 |
| 2007/0038914 | A1 * | 2/2007 | Bickerstaff et al. | 714/758 |
| 2007/0089025 | A1 * | 4/2007 | Hong et al. | 714/758 |
| 2007/0245217 | A1 * | 10/2007 | Valle | 714/758 |
| 2008/0065953 | A1 * | 3/2008 | Sun et al. | 714/757 |
| 2008/0065956 | A1 * | 3/2008 | Blankenship et al. | 714/758 |
| 2008/0320374 | A1 * | 12/2008 | Prabhakar et al. | 714/801 |
| 2010/0251059 | A1 * | 9/2010 | Dielissen | 714/752 |
| 2011/0179337 | A1 * | 7/2011 | Chen et al. | 714/763 |
| 2011/0264979 | A1 * | 10/2011 | Gunnam et al. | 714/752 |
| 2011/0289382 | A1 * | 11/2011 | Shih et al. | 714/763 |
| 2012/0233524 | A1 * | 9/2012 | Varnica et al. | 714/769 |
| 2013/0139038 | A1 * | 5/2013 | Yosoku et al. | 714/780 |

OTHER PUBLICATIONS

Fewer, C.P.; Flanagan, M.F.; Fagan, A.D.; , "A Versatile Variable Rate LDPC Codec Architecture," Circuits and Systems I: Regular Papers, IEEE Transactions on , vol. 54, No. 10, pp. 2240-2251, Oct. 2007, doi: 10.1109/TCSI.2007.904641.*

Tanner, R.M.; Sridhara, D.; Sridharan, A.; Fuja, T.E.; Costello, D.J., Jr.; , "LDPC block and convolutional codes based on circulant matrices," Information Theory, IEEE Transactions on , vol. 50, No. 12, pp. 2966-2984, Dec. 2004, doi: 10.1109/TIT.2004.838370.*

(Continued)

*Primary Examiner* — Albert Decady
*Assistant Examiner* — Justin R Knapp
(74) *Attorney, Agent, or Firm* — McDermott Will & Emery LLP

(57) ABSTRACT

The subject technology provides a decoding solution that supports multiple choices of code rates. A decoder may be configured to receive a selected code rate from a plurality of code rates. On the selection of the code rate, the decoder may determine a circulant size based on the code rate, and, on receiving the codeword, update, during one or more parity-check operations, a number of confidence values proportional to the circulant size in each of a plurality of memory units, each number of confidence values corresponding to a portion of the codeword.

20 Claims, 6 Drawing Sheets

(56) References Cited

OTHER PUBLICATIONS

"Low-Density Parity-Check Code," Wikipedia (Jan. 1, 2012), retrieved from the Internet <http://en.wikipedia.org/wiki/Ldpc>.

"Generating the Parity Check Matrix" (retrieved on Nov. 3, 2011), retrieved from the Internet <http://arun-10.tripod.com/Idpc/generate.html>.

* cited by examiner

LOW DENSITY PARITY CHECK CODE DECODING SYSTEM AND METHOD

CROSS-REFERENCES TO RELATED APPLICATIONS

This application claims priority from U.S. Provisional Application No. 61/513,480, filed Jul. 29, 2011, which is incorporated herein by reference in its entirety.

TECHNICAL FIELD

The subject technology relates generally to data storage solutions that utilize Low Density Parity Check (LDPC) for error correction coding (ECC).

BACKGROUND

Data storage applications (for example, solid state drives, hard disk drives, and the like) may use LDPC to correct errors that occur when storing and reading or sending and receiving information. One design choice in planning LDPC coding systems is an amount of redundancy (ECC parity bits) used to meet the product specification. This redundancy is represented by the code rate of an LDPC code, which is equal to the extra redundancy length divided by the total number of bits stored. The general trend is that the lower the code rate is (more redundancy is added), the better the user data is protected and the better the error correcting performance is. If the code rate is chosen too high, the device may fail before the targeted Program/Erasure lifetime. On the other hand, if the code rate is chosen too low, extra storage space may be wasted. Different LDPC encoder/decoder designs are implemented for different code rates and for different chips/technologies (2× or 1×) or applications. Devices from different manufacturers may utilize different code rates, and, in that regard, code rates may span a wide range.

SUMMARY

A system and method for performing a parity check operation in a variable rate decoder is disclosed. According to one aspect, a computer-implemented method may include selecting one of a plurality of code rates, receiving a codeword encoded at the selected code rate, determining a circulant size based on the code rate, and updating, during one or more parity check operations, a number of confidence values proportional to the circulant size in each of a plurality of memory units, each number of confidence values corresponding to a portion of the codeword. The method may further include determining a plurality of circulants based on circulant size and the code rate, and, on a first code rate being selected, for each circulant, storing confidence values corresponding to the circulant in a single memory unit, on a second code rate being selected, for each circulant, merging two memory units to store confidence values corresponding to the circulant, on a third code rate being selected, for each pair of circulants, splitting one memory unit into a first section and a second section to store confidence values corresponding to the pair of circulants, half of the confidence values being stored in the first section and another half of the confidence values being stored in the second section.

In another aspect, a computer-implemented method may include receiving a selected code rate, receiving a codeword encoded at the selected code rate, determining a number of circulants for use in one or more parity check operations based on the code rate, and, on receiving a first code rate, for each circulant, storing a number of log-likelihood ratios corresponding to the circulant in a single memory media, each log-likelihood ratio corresponding to a bit of the received codeword, and, on receiving a second code rate, for each circulant, splitting one memory media into a first section and a second section to store the number of log-likelihood ratios corresponding to the circulant, half of the log-likelihood ratios being stored in the first section and another half of the log-likelihood ratios being stored in the second section. In this regard, the method may further include, on receiving a third code rate, for each circulant, merging two memory medias to store the number of log-likelihood ratios corresponding to the circulant, half of the log-likelihood ratios being stored in a first memory media and another half of the log-likelihood ratios being stored in a second memory media.

In other aspects, a low density parity check code decoding system may include a plurality of memory units, one or more data buffers, a plurality of memory mappers, and a configuration memory. Each memory mapper may be configured to, on being activated, map one or more confidence values stored in one or more respective memory units to the one or more data buffers based on a corresponding active circulant matrix. The configuration memory may include instructions for, when executed, receiving a selected one of a plurality of code rate modes, each code rate mode activating a number of memory mappers and determining how many confidence values are stored in each memory unit.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

The subject technology provides a low density parity check code decoder that supports different code rates, and maintains a low overall footprint of internal memory space required for processing the variable-rate codewords. In this regard, the decoder may be initially set to receive codewords encoded to one of a predetermined plurality of code rates. On receiving a codeword encoded at a selected code rate, the decoder may automatically determine a circulant size based on the selected code rate, and, determine, during one or more parity check operations, a number of confidence values (for example, log-likelihood ratios) corresponding to the received codeword. The confidence values may then be stored in a plurality of memory units, with each memory unit being allocated a space proportional to the determined circulant size.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Generally, a codeword c is generated from the product of a generator matrix G, and a user payload U (for example, a series of bits of data), such that G·U=c. In some aspects of the subject technology, the G matrix may be constructed as G= $g_{(identity)}+g_{(x)}$, where $g_{(identity)}$ is an identity matrix and $g_{(x)}$ includes a bit pattern determined, for example, by an error correction algorithm. In this manner, a raw bit pattern of c may include a first section providing the original user payload U and a second section including error correction data generated by the product of U and G.

Figure 1:
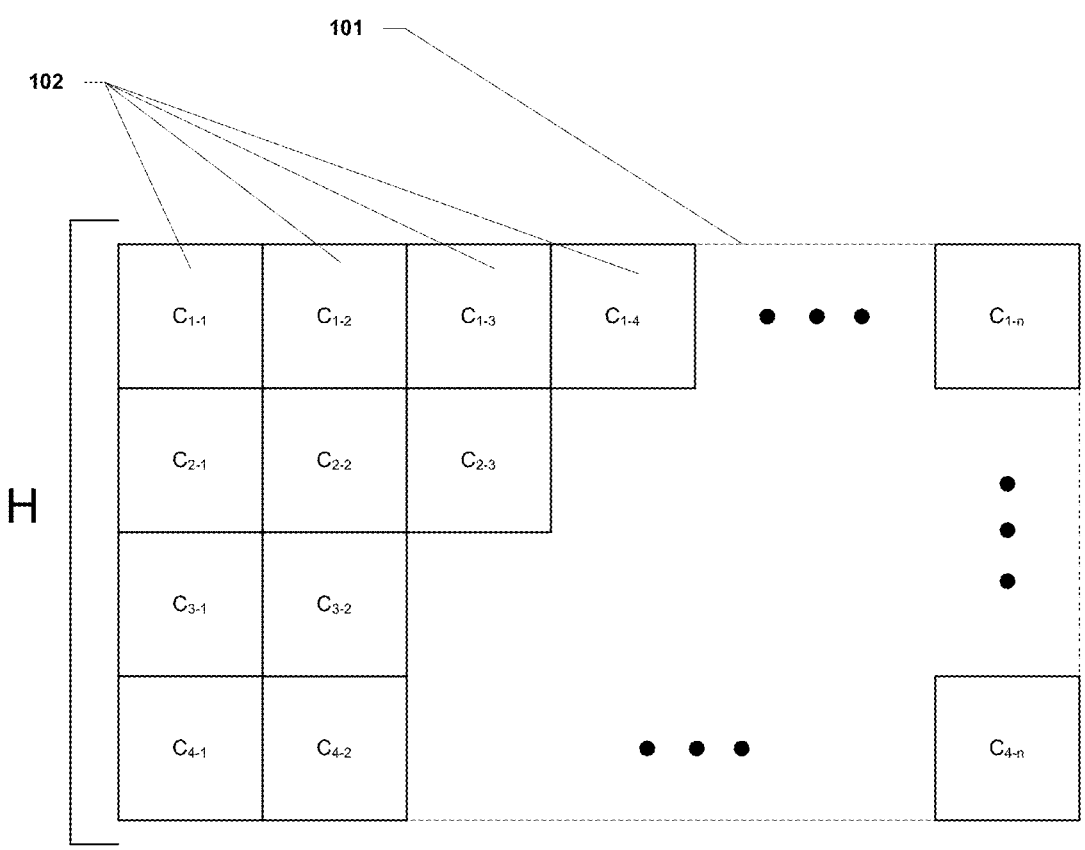
FIG. 1 depicts an exemplary parity-check matrix that may be used to decode a LDPC codeword according to one aspect of the subject technology.

FIG. 1 depicts an exemplary parity-check matrix 101 that may be used to decode a LDPC codeword according to one aspect of the subject technology. Generally, a parity-check matrix 101, also termed an "H matrix", may be generated from a corresponding G matrix (and vice versa), such that $G \cdot H^T=0$. Each bit position of a row in the parity-check matrix may correspond to a bit position of a codeword x (not shown), such that, a product of the codeword x and a row of the matrix produces a zero result, for example, $H^i \cdot x^T=0$ for any selected row i.

Parity-check matrix 101 may be constructed such that it includes many more 0 or null values than non-zero values (for example, 1's) at each row position. In one aspect according to the subject technology, parity-check matrix 101 may be constructed from a number of circulants 102. A circulant 102 may be a sub-matrix in the form of an identity matrix. In some aspects, each circulant 102 of parity-matrix 101 may be a permutation of a single pxp identity matrix, for example, by cyclically shifting the identity matrix. In other aspects, for each circulant 102, a system may store (for example, in a memory) a non-zero starting bit position (column or row) of the circulant so that the circulant may be generated by cyclically shifting the starting bit position to complete the circulant. In this regard, a memory or other storage device for storing information to generate circulants 102 may need only include a number of bits required to generate one bit position for each circulant in parity-check matrix 101. For example, to store 4 rows of 24 circulants, each circulant having a circulant size p=192, a memory size of 864 bytes may be required (9 bits×4×24).

Figure 2:
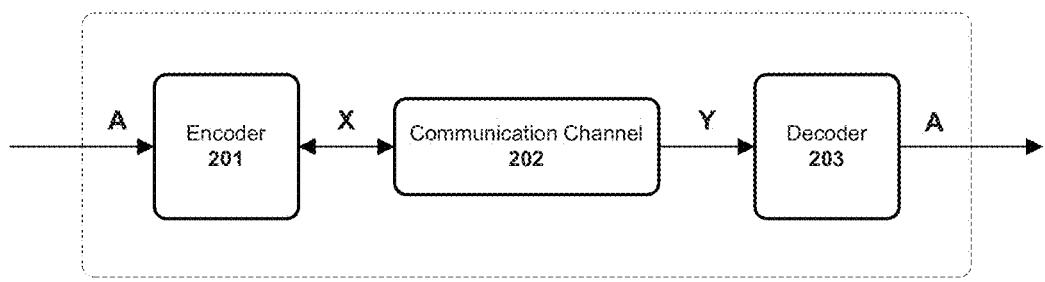
FIG. 2 depicts an exemplary encoder, communication channel 102, and decoder 103 for the encoding, transmission, and decoding of data according to one aspect of the subject technology.

FIG. 2 depicts an exemplary encoder 201, communication channel 202, and decoder 203 for the encoding, transmission, and decoding of data according to one aspect of the subject technology. Encoder 201 may process an input data A to produce a codeword X. Codeword X may include a user payload appended by error correction data. Encoder 201 may encode a user payload A using, for example, the previously described G matrix, to produce a codeword X. Codeword X may be transmitted over communication channel 202 to decoder 203. Decoder 203 may perform data decoding operations including, for example, previously described parity check matrix 201, to reconstruct codeword X. As part of decoding operations, decoder 203 may attempt to reconstruct the original word $X=\{x_i, x_2, \ldots x_n\}$ from a received word $Y=\{y_i, y_2, \ldots y_n\}$. Received word Y may include soft values (unverified values) for $y_1, y_2, \ldots y_n$ provided from, for example, a channel detector (for example, a soft-output Viterbi detector). Once codeword X has been reconstructed, decoder 203 may include a channel decoder for removing the redundant error correction data to produce original data input A.

Figure 3:
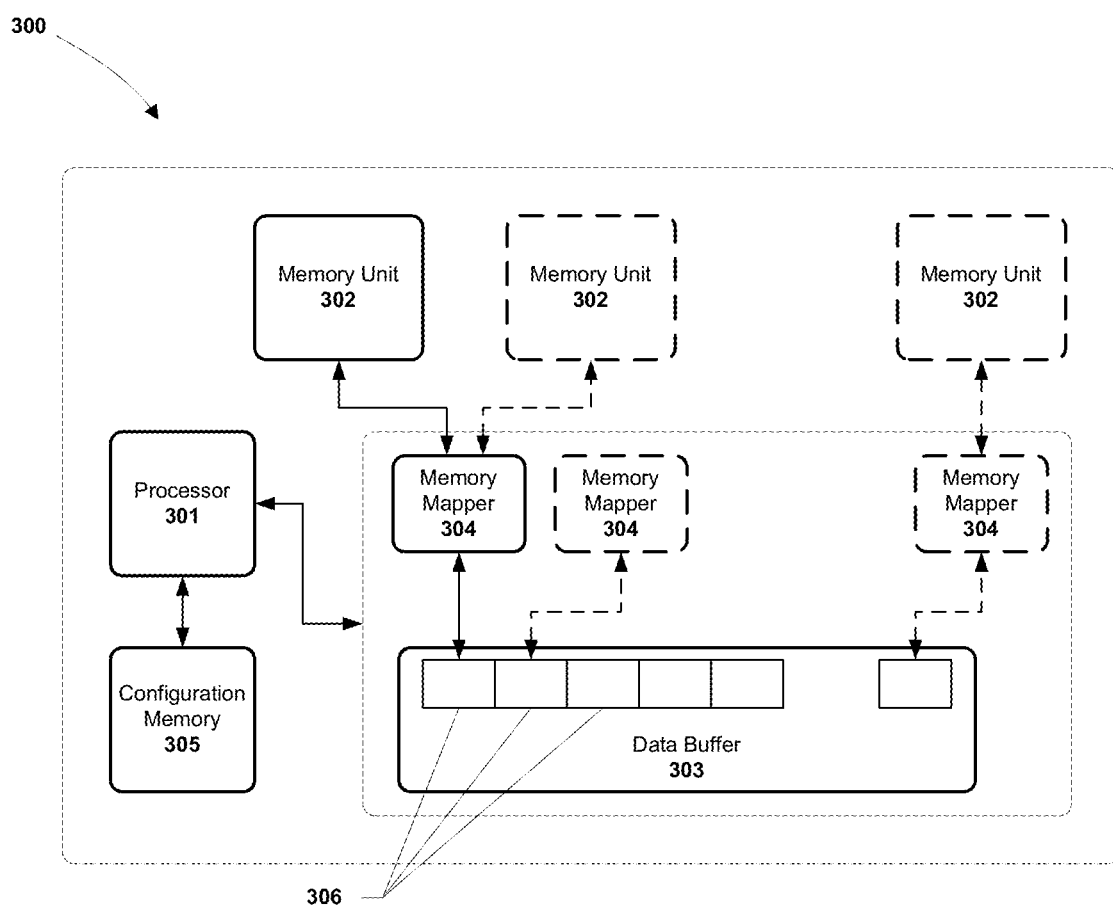
FIG. 3 depicts an exemplary system for decoding of data according to one aspect of the subject technology.

FIG. 3 depicts an exemplary system for decoding of data according to one aspect of the subject technology. A low density parity check code decoding system 300 (for example, implemented as decoder 203) may include a processor 301, a plurality of memory units 302 (for example, memory banks, flash memory chips, or the like), a data buffer 303, a plurality of memory mappers 304, and a configuration memory 305. Each memory unit 302 may provide storage for an equal number of confidence values. In this regard, each of the stored confidence values may represent a log-likelihood ratio (LLR) corresponding to a bit of a received codeword.

In low-density parity-check (LDPC) applications, for example, a LLR may include the logarithm of a ratio between the probability of a bit being "0" or "1". A positive LLR may generally indicate that a signal read from the memory cell may likely be a 0-bit, and a negative LLR may generally indicate that the signal read from the memory cell may likely be a 1-bit. Each assigned LLR may correspond to a bit value received from a communication channel (for example, communication channel 202). In one example, a bit value having an assigned LLR equal to five may be more likely to be a 0 than a bit having an assigned LLR equal to 1. A bit having an assigned LLR equal to zero may be equally likely to be a 1 or a 0.

The decoding process of the subject technology may include a process of updating LLRs from other LLRs (for example, using a min-sum decoding technique) using data buffer 303. Data buffer 303 may be configured as a temporary storage for a number of confidence values processed at any one time, with each buffer location 306 of data buffer 303 temporarily storing one confidence value (for example, as a series of bits). Each stored confidence value may represent a level of certainty that the raw bit value it corresponds to is what it purports to be. Decoding system 300 may use a parity-check matrix (for example, parity-check matrix 101) to generate and/or update the stored confidence values in data buffer 303 during a decoding of the received codeword. Not all bit values of a received codeword may be processed simultaneously, but, rather the bit values may be processed based on a parity check equation generated from a processed row of the parity-check matrix.

In this regard, during the parity-check operation, the circulants that make up the parity-check matrix may determine which bit values in the codeword are processed, and consequently what bit values are stored or updated in a corresponding buffer location 306. As described previously, the parity-check matrix may comprise one or more rows of circulants (for example, circulants 102), with each circulant comprising an identity matrix. System 300 may iterate each sub-row of the row of circulants, and the bit values of the codeword corresponding to the currently processed sub-row (for example, the active row) may be stored in respective buffer locations of data buffer 303. Since each row of a single identity matrix (for example, each sub-row of a row of circulants) comprises only one non-null value, the number of buffer locations 306 may be equal to the number of identity matrices in any given row of circulants. For example, if there are 24 circulants in a first row of the parity-check matrix then data buffer 303 may include 24 buffer locations 306, each storing a respective confidence value.

Configuration memory 305 may include data values for generating the previously described parity-check matrix, including one or more rows of the previously described circulants. It may be not necessary to store a complete circulant in configuration memory 305. In one aspect, configuration memory 305 stores a value corresponding to a starting bit position for each circulant to be generated. In this regard, the number of stored values may correspond to the number of circulants in a given parity-check matrix. For example, if the parity check matrix includes 4 rows of 24 circulants, each circulant including an identity matrix having 192 rows, then 9 bits may be required to store the first bit position of each identity matrix, for a total of 864 bits to generate the completed parity-check matrix (9×4×24). The number of bits required to generate a parity-check matrix may remain constant for any number of circulant variations for a given codeword size. Accordingly, configuration memory 305 may be sized based on an expected codeword size.

Configuration memory 305 may include mapper instructions that, when executed by processor 301, activate a number of memory mappers 304. In some aspects, the number of memory mappers 304 that are activated corresponds to a number of buffer locations 306. Each memory mapper 304 may determine a mapping between each buffer location 306 and one or more memory units 302. In this regard, each memory mapper 304 may determine how many confidence values are stored in each memory unit 302, based on a received code rate mode. The code rate mode may, for example, by stored in configuration memory 305 or provided as a series of bits accessible to the mapper instructions.

In one aspect, each mapping between a buffer location 306 and one or more respective memory units 302 may be based on a corresponding active circulant matrix. For example, the non-null value of each previously described identity matrix may provide, to a corresponding active memory mapper 304, a mapping between a buffer location 306 and a respective memory unit. Each buffer location 306 may temporarily store a confidence value (for example, an LLR) corresponding to a bit value of a received codeword at a current position of the non-null value of a corresponding identity matrix (for example, in an active circulant row of the previously described parity-check matrix).

System 300 may support multiple memory mappings, including, for example, a different memory mapping for each of a predetermined number of code rates. Given a selected code rate, processor 301 may determine how many circulants are in each row of the parity-check matrix (for example, row weight), how many row of circulants are in the parity-check matrix (for example, column weight), circulant size, and the like, and then generate the parity-check matrix based on the previously described information stored in configuration memory 305.

On a first code rate being selected, for each circulant, system 300 may store confidence values corresponding to the circulant in a single memory unit. In one aspect, the number of active memory mappers 304 may be equal to the number of circulants used by system 300 in the decoding operation. Each active memory mapper 304 may facilitate storing a set of confidence values in one memory unit 302, a size of the set of confidence values corresponding to a size of a corresponding active circulant matrix. (for example, 144, 128, 96, or the like). In this regard, a data buffer corresponding to a number (for example, 48) of first-sized circulants (for example, 96 rows in each circulant) may be automatically mapped to a first set of memory units (for example, 48) to facilitate updating a number of confidence values equal to a size of a respective first-sized circulant (for example, 96) in each of the first set of memory units. The number of first-sized circulants may equal the number of the first set of memory units.

On a second code rate being selected, system 300 may be set to a "merge" mode. For each circulant, two memory units 302 may be merged to store confidence values corresponding to one circulant. Each active memory mapper 304 may facilitate storing one set of confidence values in each of the two memory units 302, the size of the one set corresponding to a size of half of the corresponding active circulant matrix. In this regard, a data buffer corresponding to a number (for example, 24) of second-sized circulants (for example, 192 rows in each circulant) may be automatically mapped to the previously described first set of memory units (for example, 48) to facilitate updating a number of confidence values (for example, 96) corresponding to half of the size of a respective second-sized circulant (for example, 192) in each memory unit 302. The number of second-sized circulants may be half the number of first-sized circulants.

In some aspects, the number of code rates supported may be expanded by decreasing a number of active memory units 302 while expanding circulant size. For example, on a third code rate being selected, for each circulant, system 300 may store confidence values corresponding to the circulant in a single memory unit, but the number of active memory units 302 and memory mappers 304 used may be less than the number used for the first code rate. In this manner, the size of actual stored data in each active memory unit may be reduced in size. As in the first code rate, each active memory mapper 304 may facilitate storing a set of confidence values in one memory unit 302, a size of the set of confidence values corresponding to a size of a corresponding active circulant matrix. (for example, 144, 128, 96, or the like). A data buffer corresponding to a number (for example, 32) of third-sized circulants (for example, 144 rows in each circulant) may be automatically mapped to a second set of memory units (for example, 32) to facilitate updating a number of confidence values equal to a size of a respective third-sized circulant (for example, 144) in each of the first set of memory units. The number of third-sized circulants may equal the number of the second set of memory units, and the number of third-sized circulants may be less than a number of the previously described first-sized circulants.

On a fourth code rate being selected, system 300 may be set to a "split" mode. For each circulant, each active memory unit 302 may be split into a first section and a second section to store confidence values corresponding to two circulants. Half of the confidence values (for example, corresponding to a first circulant) may be stored in the first section and another half of the confidence values (for example, corresponding to a second circulant) may be stored in the second section. Accordingly, each active memory mapper may facilitate storing in the first section a first set of confidence values, and may facilitate storing in the second section a second set of confidence values. The size of the first set and the size of the second set may be equal to a size of a corresponding active circulant matrix (for example, 72). In this regard, a data buffer corresponding to a number (for example, 64) of fourth-sized circulants (for example, 72 rows in each circulant) may be automatically mapped to the second set of memory units (for example, 32) to facilitate updating the first number of confidence values in the first section of each of the second set of memory units, and the second number of confidence values in the second section of each of the second set of memory units. The first number and second number of confidence values may be equal to a size of a respective fourth-sized circulant (for example, 72). The number of fourth-sized circulants may be equal to twice the number of the previously described third-sized circulants and twice the number of the previously described second set of memory units.

Accordingly, the subject technology provides one solution that may be able to accommodate multiple LDPC codes with different code rates (for example, 0.8333~0.9375) with a complexity comparable to a decoder implementation that accommodates only a single LDPC code (encoder/decoder). The subject technology may be intended to be used in products using different flash chips with different raw error rates. This way, an ASIC used to implement the controller, encoder, and decoder aspects can be lot more versatile than single LDPC code implementations.

In one example, the targeted LDPC code lengths may be constant (for example, 4608 bits) due to a format requirement. And within the code rate range, five code rates may be selected to be implemented. As described previously, a LDPC code parity-check matrix may be comprised of circulants. Table A provides information for generating a parity-matrix based on code rate. The "row weight" parameter indicates how many circulants are included in a row of a corresponding parity-check matrix, further, and column weight indicates how many rows of circulants may be included in a parity-check matrix. The "circulant size" parameter indicates the number of rows in any given circulant, and, consequently, the number of non-null values of the identity matrix comprising the circulant. Different codes have different circulant sizes and different row weights.

TABLE A

| Code name | Length | Rate | User Payload | Circulant size | Column weight | Row weight |
|---|---|---|---|---|---|---|
| POR4 | 4608 | 0.8333 | 3840 | 192 | 4 | 24 |
| POR5 | 4608 | 0.8750 | 4032 | 144 | 4 | 32 |
| POR6 | 4608 | 0.8889 | 4096 | 128 | 4 | 36 |
| POR7 | 4608 | 0.9167 | 4224 | 96 | 4 | 48 |
| POR8 | 4608 | 0.9375 | 4320 | 72 | 4 | 64 |

In order to support multiple LDPC codes with different rates in one implementation, a straightforward design may include major parts of system 300 being duplicated. The biggest components in a LDPC decoder (for example, decoder 203) are memory units 302 ("the variable node memories"). As described previously, each variable node memory may be used to store the log-likelihood ratios for a group of variable nodes with a size of a circulant. At low rate codes, the circulant size (indicating the variable node memory size) may be larger, but the decoder may have fewer circulants (and, for example, fewer memory units 302). To the contrary, a high rate code may have a smaller circulant size (indicating a smaller memory size) but utilize many more circulants (and, for example, many more memory units 302).

Figure 4:
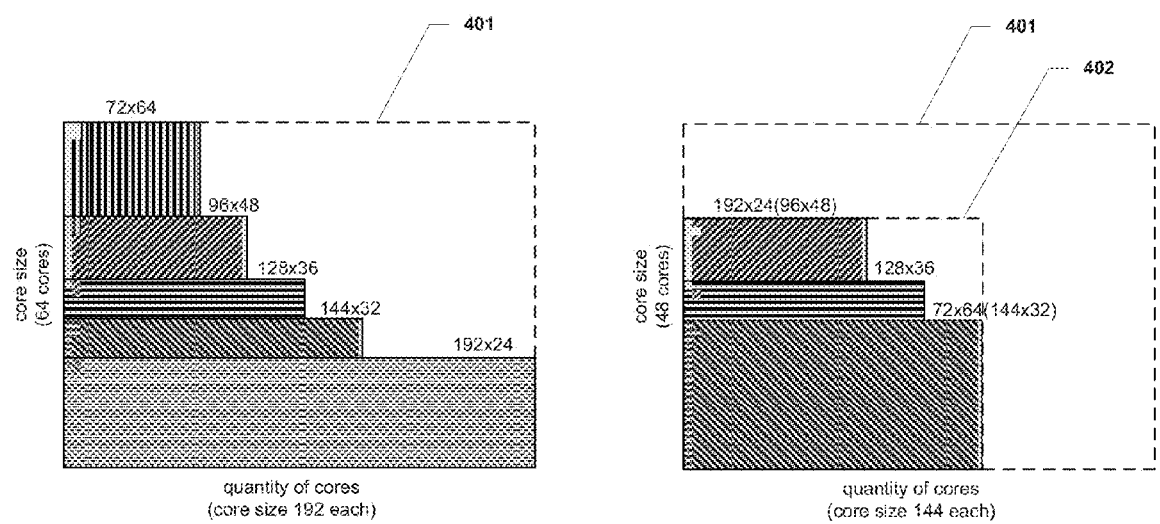
FIG. 4 depicts an exemplary memory sizing of a memory unit according to one aspect of the subject technology.

FIG. 4 depicts an exemplary memory sizing of a memory unit according to one aspect of the subject technology. A first memory core size 401 may be implemented to accommodate five different memory topologies corresponding code rates listed in Table A. For example, a default decoder implementation may contain the largest number of memory units 302 to accommodate the largest row weight (for example, 64), with each memory unit comprising storage space for the largest circulant size (for example, storage for 192 LLRs). This may be at least three times the size of the smallest memory topology (for example, for example, 96×48), implying a memory utilization efficiency of one-third.

In order to solve this issue, an exemplary implementation of a second core size 402 may use three different memory topologies. Using values from Table A, three mid-level code rates (for example, code rates 0.8750, 0.8889, and 0.9167) are implemented using an extra large memory: a circulant size of 144, and 48 memory units 302, with straightforward addressing: each physical memory core contains LLRs corresponding to a single circulant. The two outlying modes are then addressed using the previously described "merge" mode (for a code rate of 0.8333) and the previously described "split" mode (for a code rate of 0.9375), respectively.

Figure 5A:
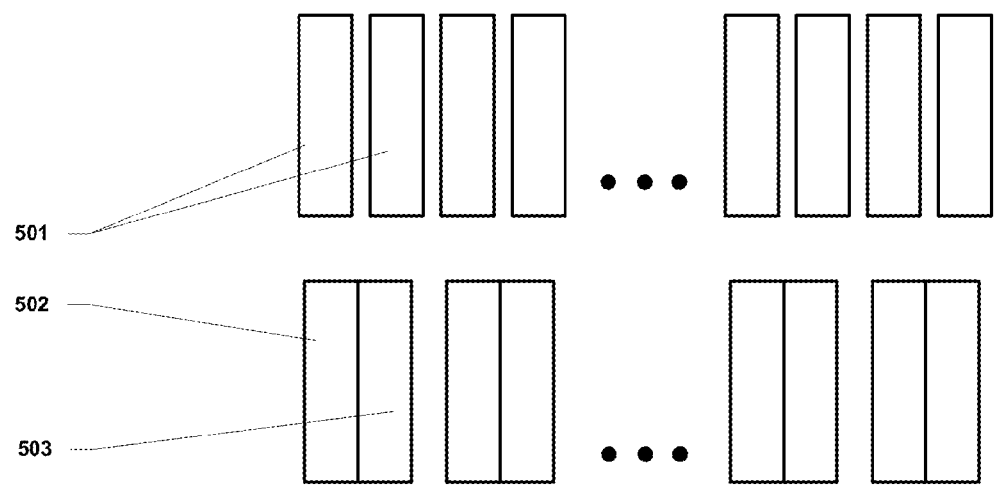
FIG. 5A depicts an exemplary process of memory core merging to accommodate confidence values corresponding to a single circulant according to one aspect of the subject technology.

FIG. 5A depicts an exemplary process of memory core merging to accommodate confidence values corresponding to a single circulant according to one aspect of the subject technology. One reason memory cores may be large may be that a decoder has to support two extreme code rates. With a larger code rate comes a larger number of circulants, requiring a larger number of memory units 501. On the other hand, with a smaller code rate, fewer circulants may be used. However, each corresponding memory may require storage capacity to hold more confidence values (for example, LLRs). In one example, the lowest code rate may use a circulant size of 192 rows, twice the size of another, higher, code rate that uses a circulant size of 96. In this regard, LLRs corresponding to each circulant may be placed into two consecutive memory cores, and only a 96 memory size may be required as opposed to a 192 memory size. One memory unit may be addressed as an upper half of memory storage 502, and the other may be addressed as a lower half of storage 503. For a code rate of 0.8333, 48 physical memory cores may be used to store values corresponding to 24 circulants.

Figure 5B:
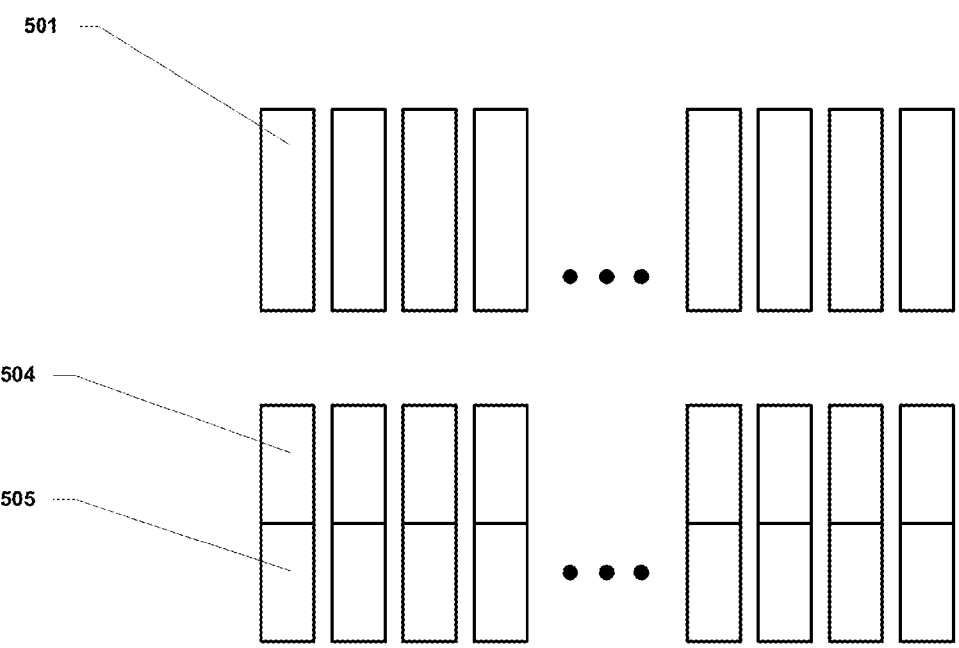
FIG. 5B depicts an exemplary process of memory core splitting to accommodate confidence values corresponding to two circulants according to one aspect of the subject technology.

FIG. 5B depicts an exemplary process of memory core splitting to accommodate confidence values corresponding to two circulants according to one aspect of the subject technology. For higher code rates (for example, using 64 circulants). One way of reducing memory topology is to split each memory unit 501 and put two circulants into each memory unit. For example, with reference to Table A, a code rate of 0.9375 may use a circulant size equal to exactly half of that used by a code rate of 0.8750. Accordingly, a code rate of 0.9375 may utilize 32 cores to implement 64 circulants, with each memory core being split into a first section 504 and a second section 505 to contain two circulants. In some aspects, pairs of circulants may be organized to each share the same memory unit. For example, a memory size of 144 may be used to contain LLRs corresponding to two circulants of size 72. LLRs corresponding to a first circulant may be stored in first section 504 and LLRs corresponding to a second circulant may be stored in second section 505.

A decoding process may require one read and one write to update variable nodes for each circulant in order to process one group of parity check equations. The arrangement may thus be contrary to a direct implementation, since, by putting two circulants in the same memory unit, two reads and two writes may be required for each parity check equation. However, in some aspects, a dual-port memory unit may not allow more than one write and one read per clock cycle. Using the previous example, a code rate of 0.9375 may only use half the number of parity check equations of a code rate of 0.8750. This leaves time to solve the previous restraint on reading and writing from the memory unit. A small data buffer may be provided at the read/write port of each memory. During each clock cycle, only 1 write/read may be performed from the memory unit. But the actual decoding process (for example, a min-sum machine, operating outside of the variable node memories) may be running only every other cycle. The idle cycle may be used to buffer the LLRs to and from the small data buffer. Even though the decoder is "decoding" only half the time, decoding at a code rate of 0.9375 may be performed in substantially the same time as decoding at a code rate of 0.8750 because only half the number of parity check equations are processed.

Given the previously described memory mappings, each memory unit 302 may comprise a maximum storage for 144 LLRs to support the code rates provided in Table A. This implementation results in a memory core set that may be 56% of the area of the previously described default decoder implementation (144×48=0.5625×192×64). A single chip may contain multiple copies (for example, 10) of decoder hardware, providing a significant saving in terms of hardware area and power.

LDPC implementations in general suffer from routing complexities. This may be mostly because of the fact that the interconnections from the variable node information memories may be very high. For example, for a parity-check matrix having circulants of size p=128 and a row weight of 36 (number of circulants in a row) and column weight of 4 (number of rows in the matrix), 36 random connections from variable node memories are needed. The randomness of this connection may be dictated by the H' matrix definition. If this H matrix may be left to be user defined, a 128 to 1 selection multiplexor may be required to process all the bits of an LLR. Such an implementation may produce an absolutely messy and near impossible solution. Moreover, a corresponding mess of wires and layers of multiplexing poses a timing critical implementation choice. This becomes even more aggravated for a high speed (>300 MHz) LDPC implementation. The subject technology may restrict encoder and decoder implementation to a fixed H matrix. By doing so, multiplexing requirements of the previous example may be reduced from 128 to 1 to 36 to 1.

As described previously, the subject technology supports multiple choices of code rates. These code rates may dictate a particular row weight of circulants, for example, from 24 to 64 (for example, in the numbers of quasi-cyclic circulants). Each code rate mode may be programmable, allowing the code development and validation of the code choice to continue concurrently. The code rate mode can also be, for example, programmed on the fly in the field. These two improvements are achievable because most of the multiplexing may be absorbed into the variable node memories. This may be done by converting the multiplexing requirements into systematic address computation. Addresses may be computed based on the base value of the circulant of that layer. The base value indicates the connection, as defined in the H matrix. Cost of address computation may be trivial in comparison to implementation of multiplexors. The subject technology thus allows implementation with a high degree of parallelism, which directly translates to a very high throughput solution. According one aspect, the subject technology may be implemented with an 8× parallelism, effecting in a throughput of $1/8^{th}$ of the number of parity bits per every iteration (for example, producing an equivalent of 4 Giga bits/second/iteration @500 MHz throughput).

The previously described memory mapping solution may accommodate H matrix options with different column weights (number of circulants in the horizontal direction). In the previously described "split mode", LLRs corresponding to two circulants (for example, column variable nodes) are stored in one memory unit 302, are read in two consecutive cycles, and then are fed to subsequent processing circuits. "Split mode" may be suitable for code rates having a very high number of smaller Circulants (for example, 64 circulants each having 72 rows). In the previously described "merge mode", LLRs corresponding to multiple circulants (for example, multiple variable nodes) are merged into one execution path. This arrangement may be suitable for code rates having a lower column weight and larger circulant size. (for example, 24 circulants each having 192 rows).

The cost of having deeper memories to accommodate the widest circulant may not be unreasonably high as the SRAM/RF structures generally do not grow proportionally to the depth (which may be typically a step function, for example, the area remains quite the same for a range of memory size). Extra sets of multiplexors between the variable node memories and the following execution units may not be very expensive as the width of these multiplexors may be very small. In some code rate modes, a portion of a memory unit 302 may remain unused. Split mode natively time slices, thus reducing the throughput by a factor of two. In split mode, much higher throughput may be achieved, however, throughput may be not reduce performance as there are much fewer check nodes (for example, parity bits) to process.

Figure 6:
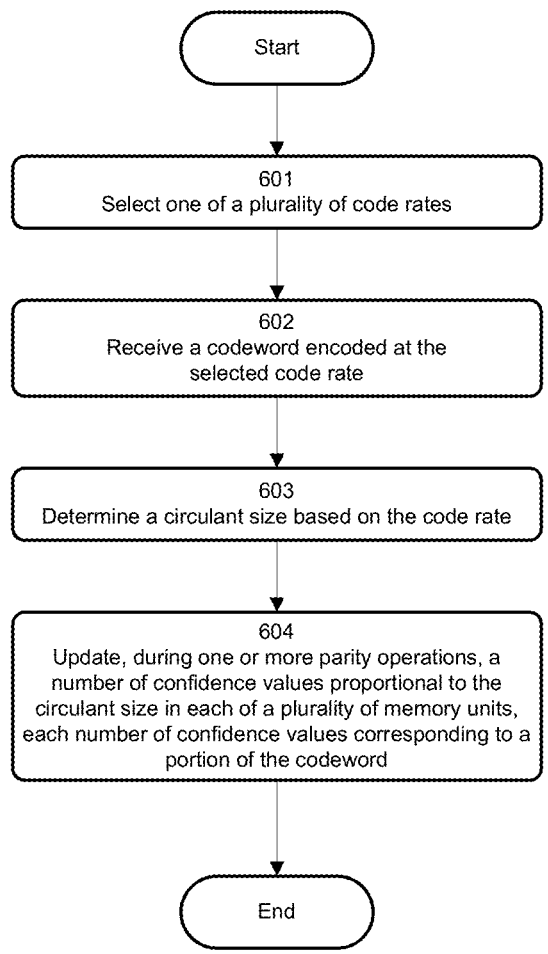
FIG. 6 is a flowchart illustrating a method of performing a parity-check operation on a variable rate codeword according to one aspect of the subject technology.

FIG. 6 is a flowchart illustrating a method of performing a parity check operation in a variable rate decoder according to one aspect of the subject technology. In step 601, one of a plurality of code rates is selected. The selection may occur, for example, through an update of a firmware controlling the decoder. In step 602, a codeword encoded at the selected code rate is received, for example, at a decoder. In step 603, a circulant size is determined based on the code rate. In one aspect, the circulant size may be a numeric value corresponding to a number of rows in the circulant. In another aspect, the circulant size may be an amount of storage required to store one or more circulants. During one or more parity check operations performed, for example, by the decoder, in step 604, a number of confidence values proportional to the circulant size in each of a plurality of memory units are updated, each number of confidence values corresponding to a portion of the codeword.

In other aspects, a plurality of circulants may also be determined based on the circulant size and the code rate. Step 604 may, for example, vary how the plurality of memory units are updated. For example, on a first code rate being selected, for each circulant, confidence values corresponding to the circulant may be stored in a single memory unit. On a second code rate being selected, for each circulant, two memory units may be merged to store confidence values corresponding to the circulant. And, on a third code rate being selected, for each circulant, one memory unit may be split into a first section and a second section to store confidence values corresponding to the circulant, half of the confidence values being stored in the first section and another half of the confidence values being stored in the second section.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A computer-implemented method for performing a parity-check operation in a variable rate decoder, the method comprising:
    selecting one of a plurality of code rates;
    receiving a codeword encoded at the selected code rate;
    determining a circulant size based on the code rate;
    updating, during one or more parity check operations, a number of confidence values proportional to the circulant size in each of a plurality of memory units, each number of confidence values corresponding to a portion of the codeword;
    automatically determining a plurality of circulants based on the circulant size and the code rate;
    determining, based on the selected code rate, a number of memory units to store confidence values for a circulant of the circulant size; and
    storing the confidence values for the circulant in the determined number of memory units.

2. The computer-implemented method of claim 1, the method further comprising:
    on a first code rate being selected, for each circulant, storing confidence values corresponding to the circulant in a single memory unit;
    on a second code rate being selected, for each circulant, merging two memory units to store confidence values corresponding to the circulant;
    on a third code rate being selected, for a pair of circulants, splitting one memory unit into a first section and a second section to store confidence values corresponding to the pair of circulants, half of the confidence values being stored in the first section and another half of the confidence values being stored in the second section.

3. The computer-implemented method of claim 1, the method further comprising:
    on a first code rate being selected, automatically mapping a data buffer corresponding to a number of first-sized circulants to a first set of memory units to facilitate updating a number of confidence values equal to a size of a respective first-sized circulant in each of the first set of memory units; and
    on a second code rate being selected, automatically mapping a data buffer corresponding to a number of second-sized circulants to the first set of memory units to facilitate updating a number of confidence values corresponding to half of the size of a respective second-sized circulant in each memory unit.

4. The computer-implemented method of claim 3, wherein the data buffer comprises one data bit for each corresponding circulant, and
    wherein the number of first-sized circulants equals a number of the first set of memory units, and
    wherein the number of second-sized circulants is half the number of first-sized circulants.

5. The computer-implemented method of claim 3, the method further comprising:
- on a third code rate being selected, automatically mapping a data buffer corresponding to a number of third-sized circulants to a second set of memory units to facilitate updating a number of confidence values equal to a size of a respective third-sized circulant in each of the second set of memory units,
- wherein the number of third-sized circulants equals a number of the second set of memory units; and
- wherein the number of third-sized circulants is less than a number of first-sized circulants.

6. The computer-implemented method of claim 5, the method further comprising:
- on a fourth code rate mode being selected, automatically mapping a data buffer corresponding to a number of fourth-sized circulants to the second set of memory units to facilitate updating a first number of confidence values in a first section of each of the second set of memory units, and a second number of confidence values in a second section of each of the second set of memory units, the first number and second number of confidence values equal to a size of a respective fourth-sized circulant,
- the number of fourth-sized circulants being equal to twice the number of third-sized circulants and twice the number of the second set of memory units.

7. A computer-implemented method for performing a parity-check operation in a variable rate decoder, the method comprising:
- receiving a selected code rate;
- receiving a codeword encoded at the selected code rate;
- determining a number of circulants for use in one or more parity-check operations based on the code rate;
- on receiving a first code rate, for each circulant, storing a number of log-likelihood ratios corresponding to the circulant in a single memory media, each log-likelihood ratio corresponding to a bit of the received codeword;
- on receiving a second code rate, splitting one memory media into a first section and a second section to store the number of log-likelihood ratios corresponding to a first circulant and a second circulant, half of the log-likelihood ratios being stored in the first section and another half of the log-likelihood ratios being stored in the second section.

8. The computer-implemented method of claim 7, the method further comprising:
- on receiving a third code rate, for each circulant, merging two memory media to store the number of log-likelihood ratios corresponding to the circulant, half of the log-likelihood ratios being stored in a first of the two memory media and another half of the log-likelihood ratios being stored in a second of the two memory media.

9. A low density parity check code decoding system, comprising:
- a plurality of memory units;
- one or more data buffers;
- a plurality of memory mappers, each memory mapper configured to, on being activated, map one or more confidence values stored in one or more respective memory units to the one or more data buffers based on a corresponding active circulant matrix; and
- a configuration memory, including instructions for receiving a selected one of a plurality of code rate modes, each code rate mode activating a number of memory mappers and determining how many confidence values are stored in each memory unit based on the selected one of the plurality of code rate modes, each code rate determining how many memory units are used to store confidence values for a single circulant.

10. The low density parity check code decoding system of claim 9, further comprising:
- a circulant memory including storage of data for generating a parity-check matrix comprising one or more rows of circulants, a bit length of each row of circulants corresponding to a codeword length,
- wherein each circulant comprises an identity matrix comprising a plurality of non-null values, each non-null value of the identity matrix providing a mapping between a memory unit mapped by an active memory mapper and a bit position in the one or more data buffers.

11. The low density parity check code decoding system of claim 10, wherein each bit position in the one or more data buffers corresponds to a current position of a non-null value located in each identity matrix of an active circulant row.

12. The low density parity check code decoding system of claim 9, wherein the one or more data buffers temporarily stores one or more confidence values mapped by each memory mapper.

13. The low density parity check code decoding system of claim 9, wherein each of the stored confidence values is a log-likelihood ratio corresponding to a bit of a received codeword.

14. The low density parity check code decoding system of claim 9, wherein each of the plurality of memory units provides storage for an equal number of confidence values.

15. The low density parity check code decoding system of claim 9, wherein, on a first code rate mode being selected, each active memory mapper facilitates storing a set of confidence values in one memory unit, a size of the set of confidence values corresponding to a size of the corresponding active circulant matrix.

16. The low density parity check code decoding system of claim 9, wherein, on a code rate mode being selected, each active memory mapper facilitates storing one set of confidence values in each of two of the plurality of memory units, the size of the one set corresponding to a size of half of the corresponding active circulant matrix.

17. The low density parity check code decoding system of claim 9, wherein, on a code rate mode being selected, each active memory mapper facilitates storing in a first section of a memory unit a first set of confidence values, and facilitates storing in a second section of the memory unit a second set of confidence values, the size of the first set and the size of the second set corresponding to a size of the corresponding active circulant matrix.

18. The low density parity check code decoding system of claim 9, further comprising:
- wherein, on a first code rate mode being selected, a first set of memory units are mapped by a corresponding first set of memory mappers to facilitate updating a first set of confidence values stored in each of the first set of memory units;
- wherein, on a second code rate mode being selected, the first set of memory units are mapped by a second set of memory mappers to facilitate updating a second set of confidence values, the second set of memory mappers being selected from half of the first set of memory mappers, each memory mapper in the second set of memory mappers mapping two memory units.

19. The low density parity check code decoder of claim 18, comprising:
- wherein, on a third code rate mode being selected, a second set of memory units are mapped by a third set of memory mappers to facilitate updating a third set of confidence values, at least a portion of the third set of memory mappers being selected from the first set of memory mappers;

wherein, on a fourth code rate mode being selected, the third set of memory mappers map a first section of memory in the second set of memory units to facilitate updating a fourth set of confidence values, and map a second section of memory in the second set of memory units to facilitate updating a fifth set of confidence values, the fourth and fifth sets of confidence values being equal in size.

20. The low density parity check code decoder of claim 19, comprising:

a memory buffer operably connected to a port of each of the second set of memory units, wherein the fourth set of confidence values are read into or written from the memory buffer during a first clock signal and the fifth set of confidence values are read into or written from the memory buffer on a second clock signal.

* * * * *